US012775024B2

(12) United States Patent
Chen et al.

(10) Patent No.: US 12,775,024 B2
(45) Date of Patent: Oct. 27, 2026

(54) TESTING SYSTEM AND TESTING METHOD OF USING THE SAME

(71) Applicant: Taiwan Semiconductor Manufacturing Company, Ltd., Hsinchu (TW)

(72) Inventors: Kuan Chun Chen, Hsinchu City (TW); Shu An Shang, Kaohsiung City (TW); Guang-Sing Huang, Hsinchu County (TW); Kai-Yi Tang, New Taipei City (TW); Hsiou-Yu He, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 139 days.

(21) Appl. No.: 18/955,787

(22) Filed: Nov. 21, 2024

(65) Prior Publication Data

US 2026/0140144 A1 May 21, 2026

(51) Int. Cl.
*G01R 1/073* (2006.01)
*G01R 1/067* (2006.01)
*G01R 31/28* (2006.01)

(52) U.S. Cl.
CPC ..... *G01R 1/07378* (2013.01); *G01R 1/06772* (2013.01); *G01R 31/2886* (2013.01)

(58) Field of Classification Search
CPC ............ G01R 1/07378; G01R 1/06772; G01R 31/2886
USPC .................................................... 324/754.07
See application file for complete search history.

(56) References Cited

U.S. PATENT DOCUMENTS

2021/0048451 A1* 2/2021 Yang .................. G01R 1/06722
2021/0302472 A1* 9/2021 Ahn ......................... G01R 1/18

* cited by examiner

*Primary Examiner* — Roberto Velez
(74) *Attorney, Agent, or Firm* — JCIPRNET

(57) ABSTRACT

Provided is a testing system and a testing method of using the same. The testing system includes a probe card for testing a device under test (DUT). The probe card includes: a space transformer; a circuit board over a first surface of the space transformer; and a probe head over a second surface of the space transformer. The probe head includes: a lower plate spaced from an upper plate by a spacer; at least two loopback probe pins respectively penetrating through the lower plate and the upper plate to carry a loopback test signal between at least two loopback bumps on the DUT; and a first shielding structure extending from a lower surface of the lower plate toward an upper surface of the DUT and horizontally disposed between the at least two loopback probe pins, wherein the first shielding structure is configured to have a ground voltage.

20 Claims, 10 Drawing Sheets

TESTING SYSTEM AND TESTING METHOD OF USING THE SAME

BACKGROUND

With the evolving of semiconductor technologies, integrated circuit (IC) devices get smaller and the functionalities continue to increase. The testing of the IC devices plays an important role in IC manufacturing to ensure the functionalities of the IC devices. Typically, the testing apparatus is configured to provide the testing signals for a device-under-test (DUT) via the probe card which includes a probe head connected to a printed circuit board (PCB). Although existing methods and apparatus of testing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
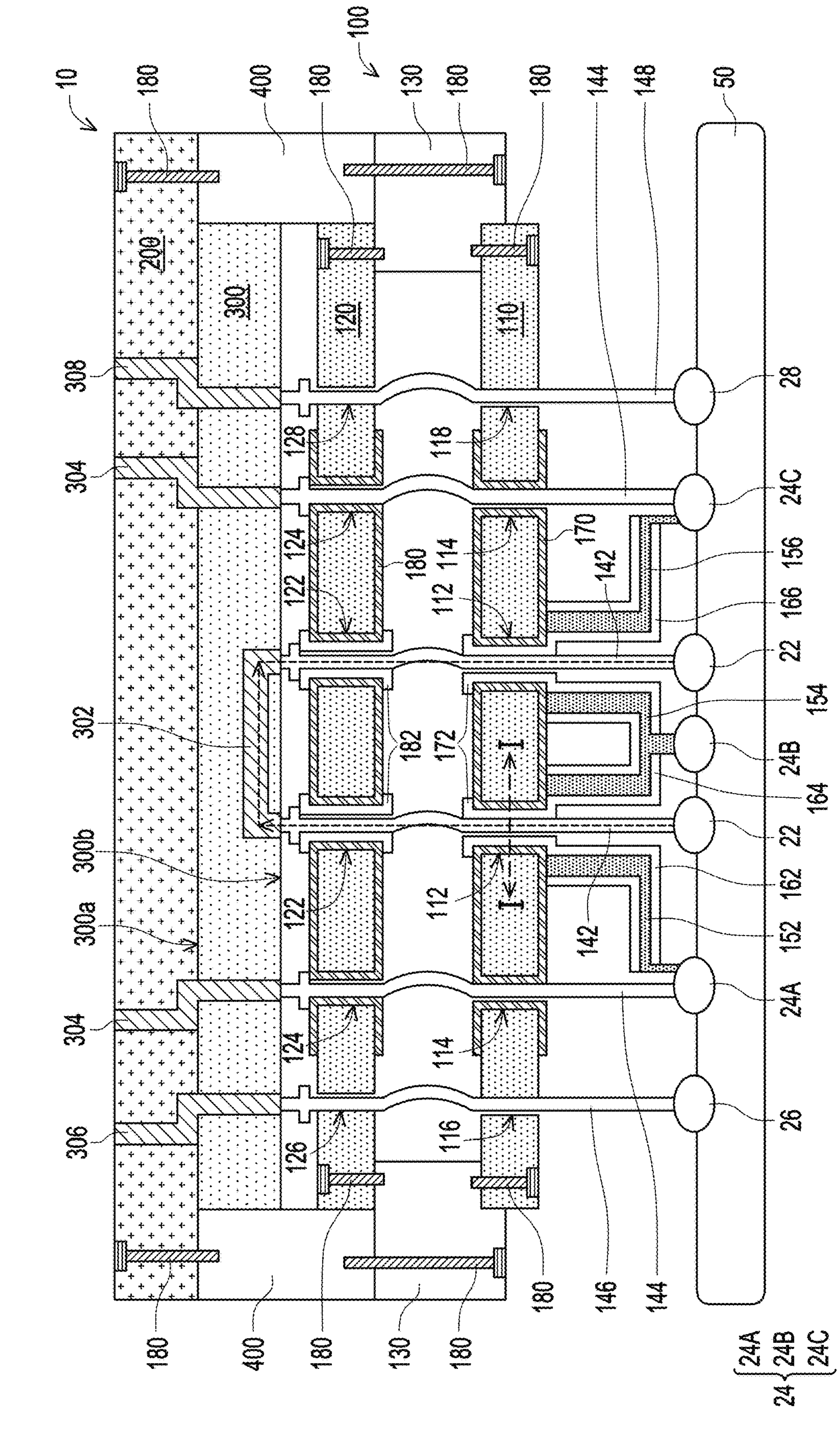
FIG. 1 illustrates a cross-sectional view of a probe card with a shielding structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A probe card having a probe head and a testing method for using the probe card are provided for performing an electrical test on a device under test (DUT) (e.g., DUT 50 shown in FIG. 1). The device under test may be a semiconductor wafer in accordance with some embodiments of the disclosure. In general, semiconductor fabrication involves numerous steps including photolithography, material deposition, and etching to form a plurality of individual semiconductor devices or integrated circuit chips (dies) on a single semiconductor wafer. Some of the individual chips formed on the wafer, however, may have defects due to variances and problems that may arise during the intricate semiconductor fabrication process. Prior to wafer dicing wherein the individual integrated circuit chips (dies) are separated from the semiconductor wafer, electrical performance and reliability tests are performed on a plurality of chips simultaneously by, for example, energizing them for a predetermined period of time (i.e., wafer level burn-in testing). The resulting electrical signals generated from the device under test are captured and analyzed by an automatic test equipment (ATE) having test circuitry to determine if a chip has a defect.

The probe card includes a plurality of contact elements (also known as probes, pins, needles, etc.), which are divided into contact elements suitable to carry power and ground signals toward the DUT, and into contact elements apt to carry operating signals, in particular input/output signals, between the test equipment and the DUT. For testing of high speed serial data transmission devices or integrated circuits, a possible method of shorting two or more contact pads of the device under test is adopted. Specifically, the DUT is used to generate the required high-frequency test signal, and then the signal are transmitted back through the probe card to the DUT for detection to achieve the purpose of high-frequency testing. This process is referred to as a loopback test. The loopback test includes sending a high-frequency test signal from the DUT, passing the signal through a transmission path, and then returning the signal to the DUT to determine whether or not the DUT works normally. However, as the pitch between the probes shortens, the high-frequency test signals between the probes would interfere with each other, thereby negatively impacting the signal integrity. Therefore, it is a challenge to provide a testing system and a testing method of using the same that can improve the signal integrity for high frequency testing.

Figure 2:
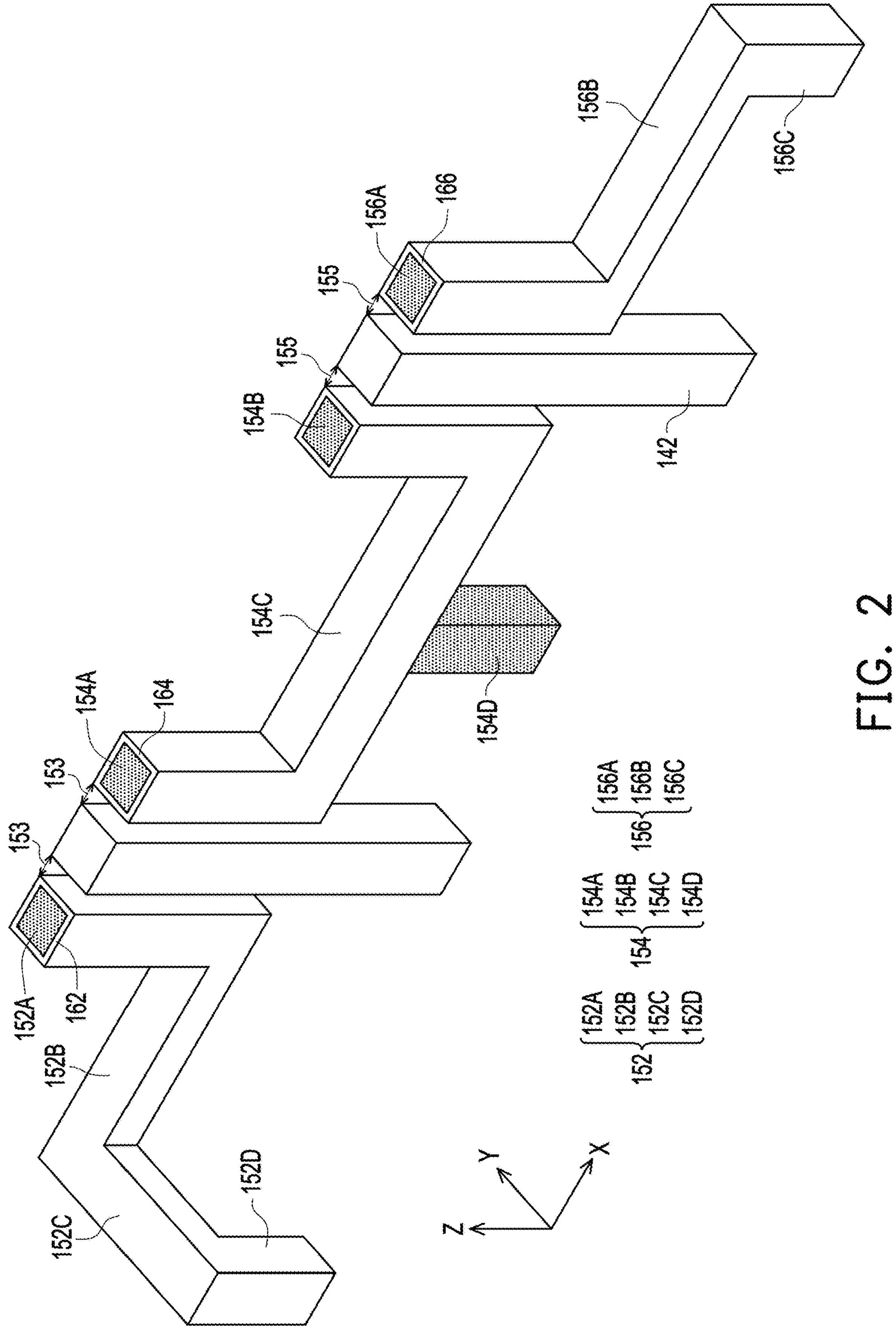
FIG. 2 illustrates a perspective view of the shielding structure of FIG. 1 in accordance with some embodiments.

FIG. 1 illustrates a cross-sectional view of a probe card with a shielding structure in accordance with some embodiments. FIG. 2 illustrates a perspective view of the shielding structure of FIG. 1 in accordance with some embodiments.

Referring to FIG. 1, a testing system having a probe card 10 for testing a device under test (DUT) 50 is provided. Specifically, the probe card 10 may include a space transformer 300, a circuit board 200, and a probe head 100. The space transformer 300 may have a first surface 300*a* and a second surface 300*b* opposite to each other. The circuit board 200 may be disposed over the first surface 300*a* of the space transformer 300. The probe head 100 may be disposed over the second surface 300*b* of the space transformer 300.

In some embodiments, the space transformer 300 may be a multi-layered organic (MLO) or multi-layered ceramic (MLC) interconnect substrate, and a material of the space transformer 300 can be adjusted according to practical requirements and is not limited in the present disclosure. The space transformer 300 has a plurality of signal lines or conductive routings therein, and contact pads are formed on the first surface 300*a* and the second surface 300*b* of the space transformer 300 to be electrically connected to the signal lines inside of the space transformer 300. A pitch between the contact pads on the first surface 300*a* is greater than a pitch between the contact pads on the second surface 300*b*. The circuit board 200 may be mechanically and electrically connected to the first surface 300*a* of the space transformer 300, while the probe head 100 may be mechanically and electrically connected to the second surface 300*b* of the space transformer 300. In this case, the first surface 300*a* may be referred to as a tester side, and the second surface 300*b* may be referred to as a wafer side. The space transformer 300 is provided so that the circuitry in the DUT 50 (e.g., a wafer) can be electrically connected to the circuit board 200 (e.g., a printed circuit board). Therefore, a spatial distribution of connectors on the DUT 50 needs to be enlarged. This process is referred to as space transform.

In some embodiments, the probe head 100 includes a lower plate 110, an upper plate 120, a spacer 130, and a plurality of probe pins 142, 144, 146, 148. The lower plate 110 may have a plurality of first openings 112, 114, 116, 118 extending from an upper surface of the first plate 110 to a lower surface of the first plate 110. The upper plate 120 may have a plurality of second openings 122, 124, 126, 128 extending from an upper surface of the upper plate 120 to a lower surface of the upper plate 120. The upper plate 120 may be disposed over the lower plate 110 and spaced from the lower plate 110 by the spacer 130. The spacer 130 may be connected between the upper plate 120 and the lower plate 110 to maintain a space between the upper plate 120 and the lower plate 110. In the present embodiment, the lower plate 110 and the upper plate 120 are mounted on an upper portion and a lower portion of the spacer 130 through fixing elements 180, such as screws, respectively. The second openings 122, 124, 126, 128 may be aligned with the first openings 112, 114, 116, 118, so that the probe pins 142, 144, 146, 148 can penetrate through the second openings 122, 124, 126, 128 and the first openings 112, 114, 116, 118, respectively. That is, the second openings 122, 124, 126, 128 may correspond to the first openings 112, 114, 116, 118, respectively. As shown in FIG. 1, the upper plate 120 and the lower plate 110 may be referred to as guild plates, so that the probe pins 142, 144, 146, 148 extends from the second surface 300*b* of the space transformer 300 toward the DUT 50. In this case, upper ends of the probe pins 142, 144, 146, 148 may be connected to the second surface 300*b* of the space transformer 300, while lower ends of the probe pins 142, 144, 146, 148 may be connected to a plurality of bumps 22, 24, 26, 28 on the DUT 50, respectively. The first openings 112, 114, 116, 118 and the second openings 122, 124, 126, 128 are used to receive the corresponding probe pins 142, 144, 146, 148 respectively, but the numbers and configurations of the first/second openings can be modified according to the numbers and configurations of the probe pins, and are not limited in this respect. The upper plate 120 and the lower plate 110 may be made of ceramic material or other suitable materials.

In some embodiments, the probe head 100 may be assembled to the second surface 300*b* of the space transformer 300 through a jig 400. The jig 400 may be a mounting ring mounted on the circuit board 200 through fixing elements 180, and the probe head 100 is disposed on the circuit board 200 through the jig 400. In detail, the spacer 130 is mounted on the jig 400 through the fixing elements 180 for connecting the probe head 100 to the circuit board 200.

In some embodiments, the probe pins 142, 144, 146, 148 may include at least two loopback probe pins 142, at least one ground probe pin 144, at least one input/output (I/O) probe pin 146, and at least one power probe pin 148. The loopback probe pins 142 may penetrate through a first group of the first openings 112 and a third group of the second openings 122 corresponding to the first group of the first openings 112 to carry a loopback test signal between at least two first bumps 22. In detail, the loopback probe pins 142 may carry the loopback test signal (e.g., high frequency signal) from one of the first bumps 22 on the DUT 50 toward another one of the first bumps 22 through the conductive routing 302 of the space transformer 300. In this case, the first bumps 22 may be referred to as loopback bumps or pads.

The ground probe pins 144 may penetrate through a second group of the first openings 114 and a fourth group of the second openings 124 corresponding to the second group of the first openings 114 to electrically couple the second bumps 24 to ground. In detail, one of the ground probe pins 144 may be electrically connected to the corresponding second bump 24 and the conductive routing 304 of the space transformer 300 to carry a ground signal. In this case, the second bumps 24 may be referred to as ground bumps or pads. Although FIG. 1 illustrates two ground probe pins 144 and three second bumps 24A, 24B, 24C, the embodiments of the present disclosure are not limited thereto. In the present embodiment, at least one ground probe pin connected to at least one second bump on the DUT is within the scope of the present disclosure. That is, the number of the ground probe pin and the second bump is not limited in the embodiments of the present disclosure.

The I/O probe pin 146 may penetrate through a fifth group of the first openings 116 and a sixth group of the second openings 126 corresponding to the fifth group of the first openings 116 to carry a I/O signal between the third bump 26 and the conductive routing 306 of the space transformer 300. In this case, the third bump 26 may be referred to as I/O bump or pad. Similarly, the power probe pin 148 may penetrate through a seventh group of the first openings 118 and an eight group of the second openings 128 corresponding to the seventh group of the first openings 118 to carry a power signal between the forth bump 28 and the conductive routing 308 of the space transformer 300. In this case, the forth bump 28 may be referred to as a power bump or pad.

In some embodiments, the probe head 100 further includes a plurality of shielding structures 152, 154, 156, a first conductive layer 170, and a second conductive layer 180. Specifically, the first shielding structure 152 may extend from the lower surface of the lower plate 110 toward an upper surface of the DUT 50 and may be horizontally disposed between the loopback probe pins 142 and one ground probe pin 144. As shown in the perspective view of FIG. 2, the first shielding structure 152 may include a first vertical portion 152A, a first horizontal portion 152B, a second horizontal portion 152C, and a second vertical portion 152D. The first vertical portion 152A may extend along a Z direction and connect the first conductive layer 170 on the lower surface of the lower plate 110. The second vertical portion 152D may extend along the Z direction and connect the second bump 24A. The first horizontal portion 152B and the second horizontal portion 152C may extend along a XY plane, and connect the lower end of the first vertical portion 152A and the upper end of the second vertical portion 152D. In some embodiments, the first horizontal portion 152B and the second horizontal portion 152C may be two suspension arms respectively extending along different directions on the XY plane. For example, the first horizontal portion 152B may extend along a X direction, while the second horizontal portion 152C may extend along a Y direction. The first vertical portion 152A and the second vertical portion 152D can increase the elasticity and mechanical strength of the probe card 10 in the vertical direction, and the first horizontal portion 152B and the second horizontal portion 152C can increase the elasticity and mechanical strength of the probe card 10 in the horizontal direction.

The second shielding structure 154 may extend from the lower surface of the lower plate 110 toward the upper surface of the DUT 50 and may be horizontally disposed between the loopback probe pins 142. As shown in the perspective view of FIG. 2, the second shielding structure 154 may include a first vertical portion 154A, a second vertical portion 154B, a horizontal portion 154C, and a third vertical portion 154D. The first vertical portion 154A and the second vertical portion 154B may extend along the Z direction and connect the first conductive layer 170 on the lower surface of the lower plate 110. The horizontal portion 154C may connect lower ends of the first vertical portion 154A and the second vertical portion 154B to form a U-shaped structure on a XZ plane. The third vertical portion 154D may extend along the Z direction and connect the second bump 24B and the horizontal portion 154C. In some embodiments, the three-dimensional configuration of the second shielding structure 154 can increase the elasticity and mechanical strength of the probe card 10 in the vertical direction and the horizontal direction.

The third shielding structure 156 may extend from the lower surface of the lower plate 110 toward the upper surface of the DUT 50 and may be horizontally disposed between the loopback probe pins 142 and the other ground probe pin 144. As shown in the perspective view of FIG. 2, the third shielding structure 156 may include a first vertical portion 156A, a horizontal portion 156B, and a second vertical portion 156C. The first vertical portion 156A may extend along the Z direction and connect the first conductive layer 170 on the lower surface of the lower plate 110. The second vertical portion 156C may extend along the Z direction and connect the second bump 24C. The horizontal portion 156B may extend along the X direction, and connect the lower end of the first vertical portion 156A and the upper end of the second vertical portion 156C. In some embodiments, the three-dimensional configuration of the third shielding structure 156 can increase the elasticity and mechanical strength of the probe card 10 in the vertical direction and the horizontal direction.

It should be noted that the shielding structures 152, 154, 156 may be formed by three-dimensional (3D) printing process, or the like. In such embodiment, the shielding structures 152, 154, 156 can have any three-dimensional configuration. For example, one or more vertical portions and one or more horizontal portions can be combined and arranged arbitrarily according to design requirements, so that the shielding structures 152, 154, 156 may connect the first conductive layer 170 and the second bump 24 on the DUT 50 at any position. In this case, the shielding structures 152, 154, 156 may be referred to as additional ground probe pins which are closer to the loopback probe pins 142 than the ground probe pins 144. Accordingly, the shielding structures 152, 154, 156 can redistribute the ground probe pins 144 standing on the second bumps 24, so that the shielding structures 152, 154, 156 that are electrically coupled to ground as close as possible to the loopback probe pins 142 to avoid the high-frequency signal interference, thereby improving the signal integrity and increasing the signal speed. In such embodiment, a minimum distance 153 between the shielding structures 152/154 and the loopback probe pins 142 is greater than or substantially equal to 6 μm, and a minimum distance 155 between the shielding structures 154/156 and the loopback probe pins 142 is greater than or substantially equal to 6 μm. Selecting the minimum distance 153/155 of greater than or substantially equal to 6 μm can avoid the undesired contacting of the shielding structures 152, 154, 156 and the loopback probe pins 142 during the testing. In some embodiments, the shielding structures 152, 154, 156 may include a low resistivity conductive material selected from the group of conductive materials including, but is not limited to, copper and copper-based alloy, tungsten, aluminum, gold, silver, titanium, or the like.

Referring back to FIG. 1, the first conductive layer 170 may overlay a surface of the first openings 112, 114 and extend to cover the upper surface and the lower surface of the lower plate 110. The ground probe pin 144 may be in direct contact with the first conductive layer 170 so that the first conductive layer 170 and the ground probe pin 144 have the same voltage (e.g., ground voltage). In this case, the ground probe pin 144 may provide the ground voltage to the shielding structures 152, 154, 156 by contacting the first conductive layer 170. Further, the shielding structures 152, 154, 156 may be in direct contact with the first conductive layer 170 on the lower surface of the lower plate 110. On the other hand, the first conductive layer 170 does not cover the surface of the other first openings 116, 118 to avoid the electrical short between the ground probe pins 144 and the I/O probe pin 146, and between the ground probe pins 144 and the power probe pin 148.

In some embodiments, the first conductive layer 170 may be a composite layer structure with three layers of materials. For example, the first conductive layer 170 may include an adhesion film contacting the lower plate 110, a conductive film over the adhesion film, and a barrier film sandwiched between the conductive film and the adhesion film. The adhesion film can increase the adhesion between the lower plate 110 and the conductive film, and may include an adhesion material such as Cr, Ti, Al, Ni, the like, or a combination thereof. The conductive film can improve the conductivity of the first conductive layer 170, and may include a conductive material such as Au, Ag, Cu, the like, or a combination thereof. The barrier film can prevent the diffusion between the adhesion film and the conductive film, and may include a barrier material such as W, Pt, $TiO_2$, Ru, Rh, the like, or a combination thereof. However, the embodiments of the present disclosure are not limited thereto. In other embodiments, the first conductive layer 170 may include one or more conductive films without adhesion film.

Similarly, the second conductive layer 180 may overlay a surface of the second openings 122, 124 and extend to cover the upper surface and the lower surface of the upper plate 120. The ground probe pin 144 may be in direct contact with the second conductive layer 180 so that the second conductive layer 180 and the ground probe pin 144 have the same voltage (e.g., ground voltage). In this case, the second conductive layer 180 can be considered as a backup of ground source in the case where the ground probe pin 144 is not in contact with the first conductive layer 170. That is, the shielding structures 152, 154, 156 may have the same voltage (e.g., ground voltage) through an electrical ground path formed by the first conductive layer 170, the second conductive layer 180, and the ground probe pins 144. On the other hand, the second conductive layer 180 does not cover the surface of the other second openings 126, 128 to avoid the electrical short between the ground probe pins 144 and the I/O probe pin 146, and between the ground probe pins 144 and the power probe pin 148. In some embodiments, the second conductive layer 180 may be a composite layer structure with three films of the said adhesion, barrier and conductive films.

Figure 3A:
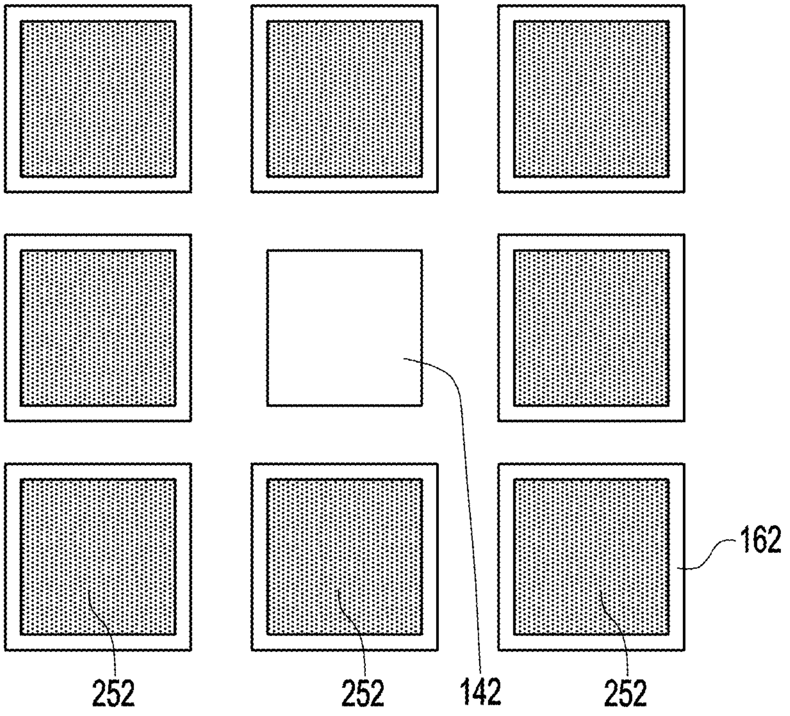
FIG. 3A and FIG. 3B illustrate top views taken along line I-I of FIG. 1 in accordance with various embodiments.
Figure 3B:
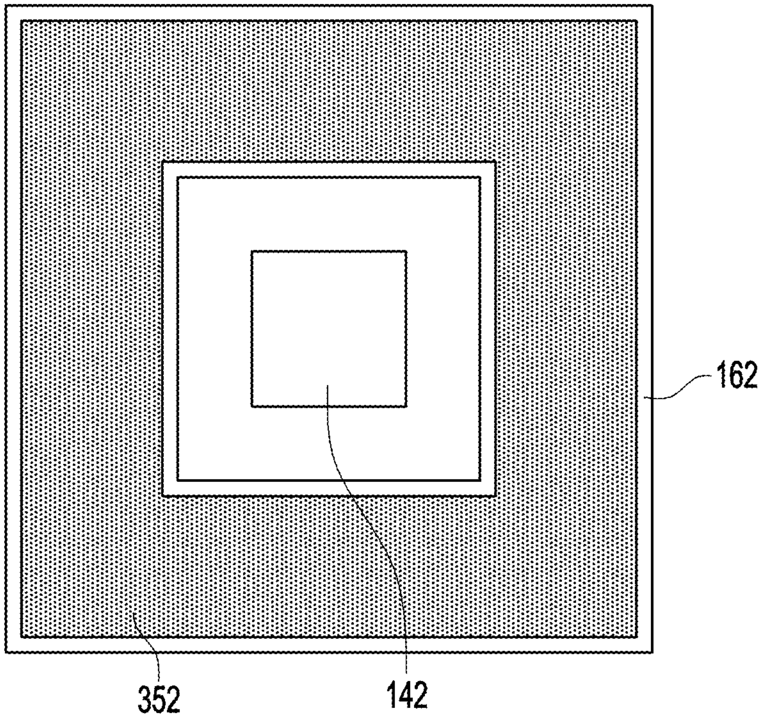

It should be noted that the shielding structures 152, 154, 156 may be configured to have the ground voltage and close to the loopback probe pins 142, so as to avoid the high-frequency signal interference, thereby improving the signal integrity and increasing the signal speed. In such embodiment, the shielding structures 152, 154, 156 may be referred to as ground shielding structures. The top view arrangement of the said shielding structures is not limited in the present disclosure. In some embodiments, a plurality of shielding structures 252 may be arranged in an array to laterally surround the loopback probe pin 142, as shown in a top view of FIG. 3A. In some alternative embodiments, a shielding structure 352 may be a continuous ring structure that laterally surround the loopback probe pin 142, as shown in a top view of FIG. 3B. Although the top view shape of the loopback probe pin 142, the shielding structures 252, 352 illustrated in FIG. 3A and FIG. 3B is rectangular, the embodiments of the present disclosure are not limited thereto. In some other embodiments, the top view shape of the loopback probe pin and/or the shielding structures may be circular, elliptical, polygonal, or the like.

In addition, the probe head 100 further includes a plurality of dielectric layers 162, 164, 166, 172, 182. Specifically, the dielectric layer 162 may overlay the surface of the first shielding structure 152 to prevent the first shielding structure 152 from contacting the loopback probe pins 142 which may cause the electrical short issue and electrical failure. Similarly, the dielectric layer 164 may overlay the surface of the second shielding structure 154 and the dielectric layer 166 may overlay the surface of the third shielding structure 156, so as to electrically isolate the second/third shielding structure 154, 156 from the loopback probe pins 142. Further, the dielectric layer 172 may overlay the first conductive layer 170 on the first group of the first openings 112 to electrically isolate the first conductive layer 170 from the loopback probe pins 142. Similarly, the dielectric layer 182 may overlay the second conductive layer 180 on the third group of the second openings 122 to electrically isolate the second conductive layer 180 from the loopback probe pins 142.

In some embodiments, the dielectric layers 162, 164, 166, 172, 182 may have the dielectric constant lower than the dielectric constant of the lower plate 110 and/or the upper plate 120. For example, the dielectric layers 162, 164, 166, 172, 182 can be typically formed with dielectric materials having low dielectric constant (low-k) or extremely low dielectric constant in an effort to decrease the signal transmission loss and improve the impedance control, thereby increasing signal speed and enhancing the signal integrity. In one embodiment, the dielectric layers 162, 164, 166, 172, 182 may have a dielectric constant less than 8, and is formed with a porous organic dielectric material. As an example, the dielectric layers 162, 164, 166, 172, 182 may include the dielectric material such as diamond-like carbon (DLC), pure silica zeolite, phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). In addition, the dielectric layers 162, 164, 166, 172, 182 may be a single-layered structure, a bi-layered structure or a multi-layered structure. Further, the dielectric layers 162, 164, 166, 172, 182 may have the same or different dielectric materials. Although FIG. 1 illustrates the dielectric layers 162, 164, 166 are connected to the dielectric layer 172, the embodiments of the present disclosure are not limited thereto. In other embodiments, the dielectric layers 162, 164, 166 may be spaced from the dielectric layer 172.

Figure 4:
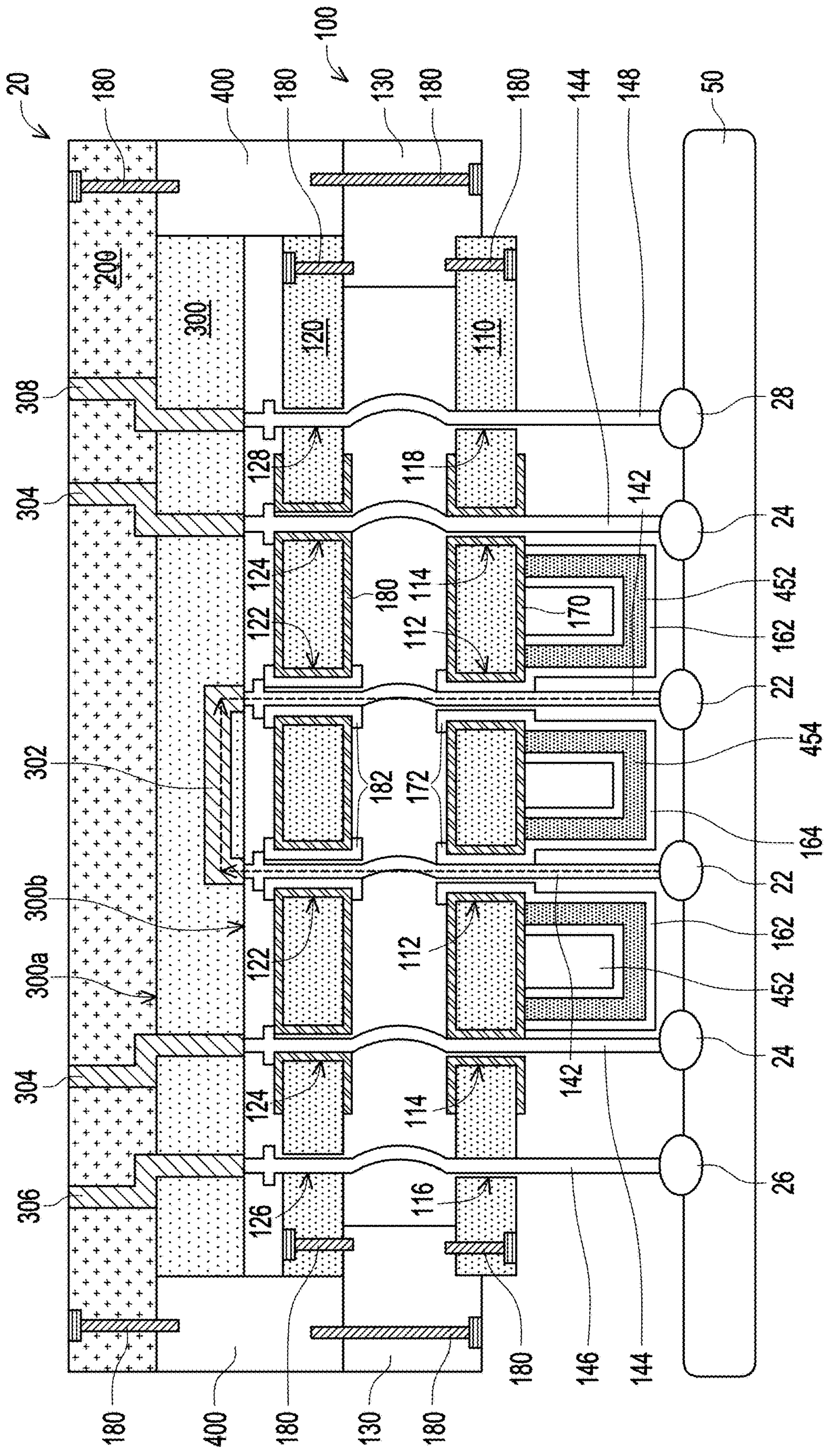
FIG. 4 illustrates a cross-sectional view of a probe card with a shielding structure in accordance with some alternative embodiments.
Figure 5:
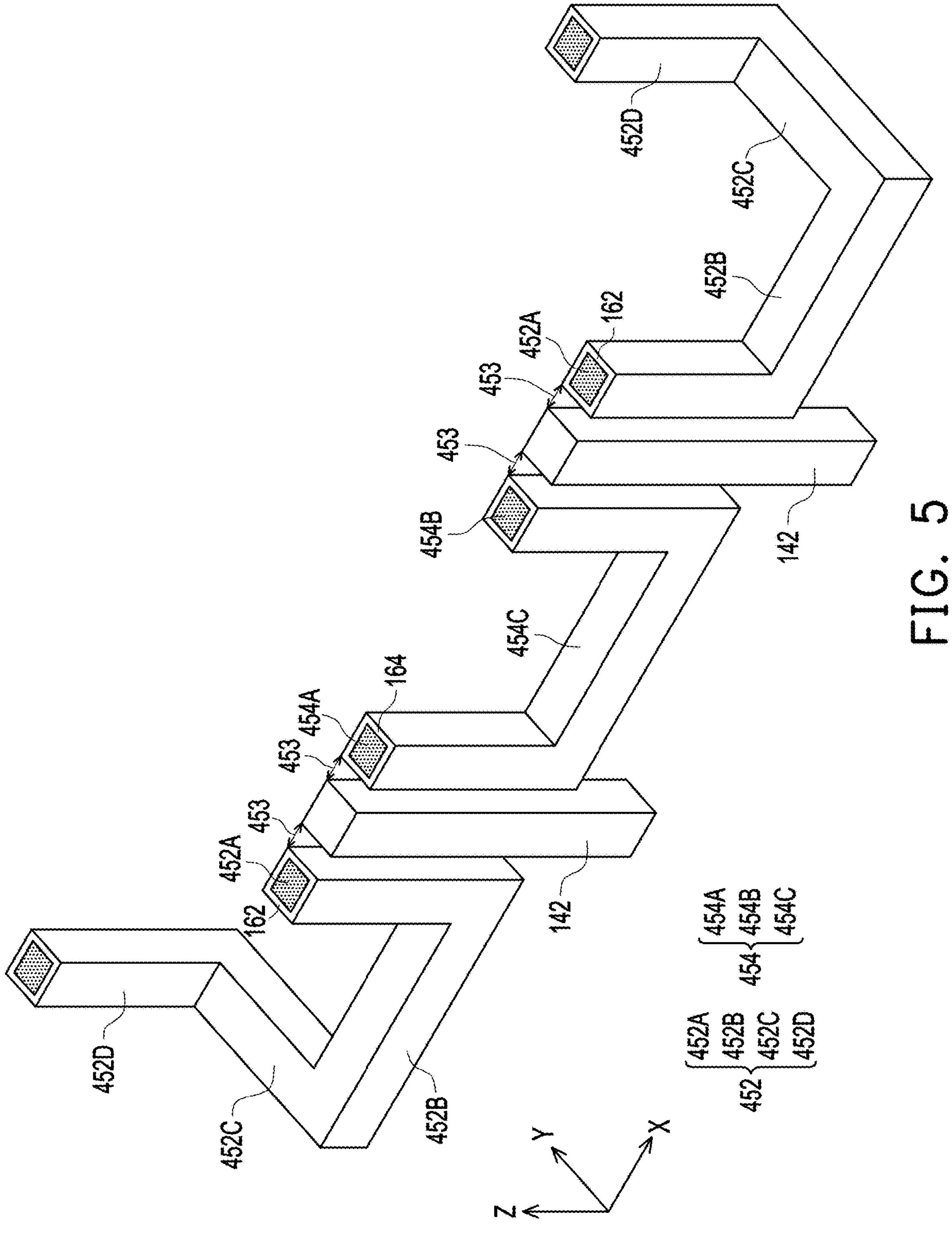
FIG. 5 illustrates a perspective view of the shielding structure of FIG. 4 in accordance with some alternative embodiments.

FIG. 4 illustrates a cross-sectional view of a probe card with a shielding structure in accordance with some alternative embodiments. FIG. 5 illustrates a perspective view of the shielding structure of FIG. 4 in accordance with some alternative embodiments.

Referring to FIG. 4, a testing system having a probe card 20 is provided. The probe card 20 is similar to the probe card 10 illustrated in FIG. 1, but the shielding structures 152, 154, 156 are replaced by the other shielding structures 452, 454 with different three-dimensional configurations. Specifically, as shown in the perspective view of FIG. 5, two first shielding structures 452 are horizontally disposed at opposite sides of the loopback probe pins 142 in a mirror image manner. The first shielding structure 452 may include a first vertical portion 452A, a first horizontal portion 452B, a second horizontal portion 452C, and a second vertical portion 452D. The first vertical portion 452A and the second vertical portion 452D may extend along the Z direction and connect the first conductive layer 170 on the lower surface of the lower plate 110. The first horizontal portion 452B and the second horizontal portion 452C may extend along the XY plane, and connect the lower ends of the first vertical portion 452A and the second vertical portion 452D. In some embodiments, the first horizontal portion 452B and the second horizontal portion 452C may be two suspension arms respectively extending along different directions on the XY plane. For example, the first horizontal portion 452B may extend along the X direction, while the second horizontal portion 452C may extend along the Y direction. In some embodiments, the three-dimensional configuration of the first shielding structure 452 can increase the elasticity and mechanical strength of the probe card 20 in the vertical direction and the horizontal direction.

The second shielding structure 454 may extend from the lower surface of the lower plate 110 toward the upper surface of the DUT 50 and may be horizontally disposed between the loopback probe pins 142. As shown in the perspective view of FIG. 5, the second shielding structure 454 may include a first vertical portion 454A, a second vertical portion 454B, and a horizontal portion 454C. The first vertical portion 454A and the second vertical portion 454B may extend along the Z direction and connect the first conductive layer 170 on the lower surface of the lower plate 110. The horizontal portion 454C may connect lower ends of the first vertical portion 454A and the second vertical portion 454B to form a U-shaped structure on the XZ plane. In some embodiments, the three-dimensional configuration of the second shielding structure 454 can increase the elasticity and mechanical strength of the probe card 20 in the vertical direction and the horizontal direction.

It should be noted that, in the present embodiment, the shielding structures 452, 454 are not connected to the ground bumps 24 on the DUT 50. That is, the shielding structures 452, 454 may have the ground voltage through the first conductive layer 170 contacting the ground probe pin 144. In this case, the number of the ground bumps on the DUT 50 can be effectively reduced to increase the chip usage area. In addition, the design of the shielding structures 452, 454 will become more flexible to meet customized needs. For example, one or more vertical portions and one or more horizontal portions can be combined and arranged arbitrarily according to design requirements, so that the shielding structures 452, 454 may connect the first conductive layer 170 at any position. In some embodiments, a minimum distance 453 between the shielding structures 452/454 and the loopback probe pins 142 is greater than or substantially equal to 6 μm. Selecting the minimum distance 453 of greater than or substantially equal to 6 μm can avoid the undesired contacting of the shielding structures 452, 454 and the loopback probe pins 142 during the testing.

Figure 6:
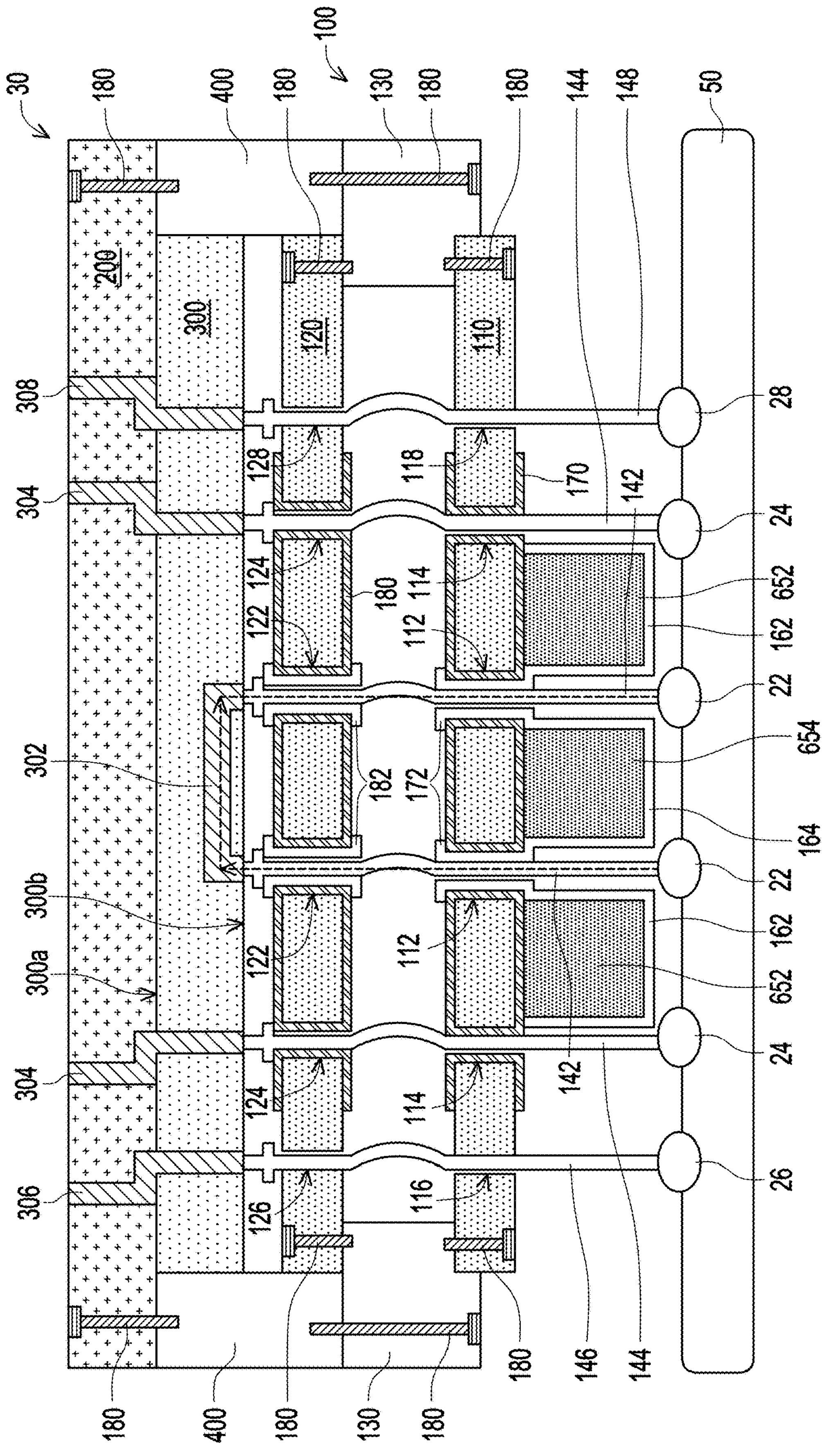
FIG. 6 illustrates a cross-sectional view of a probe card with a shielding structure in accordance with some other embodiments.
Figure 7:
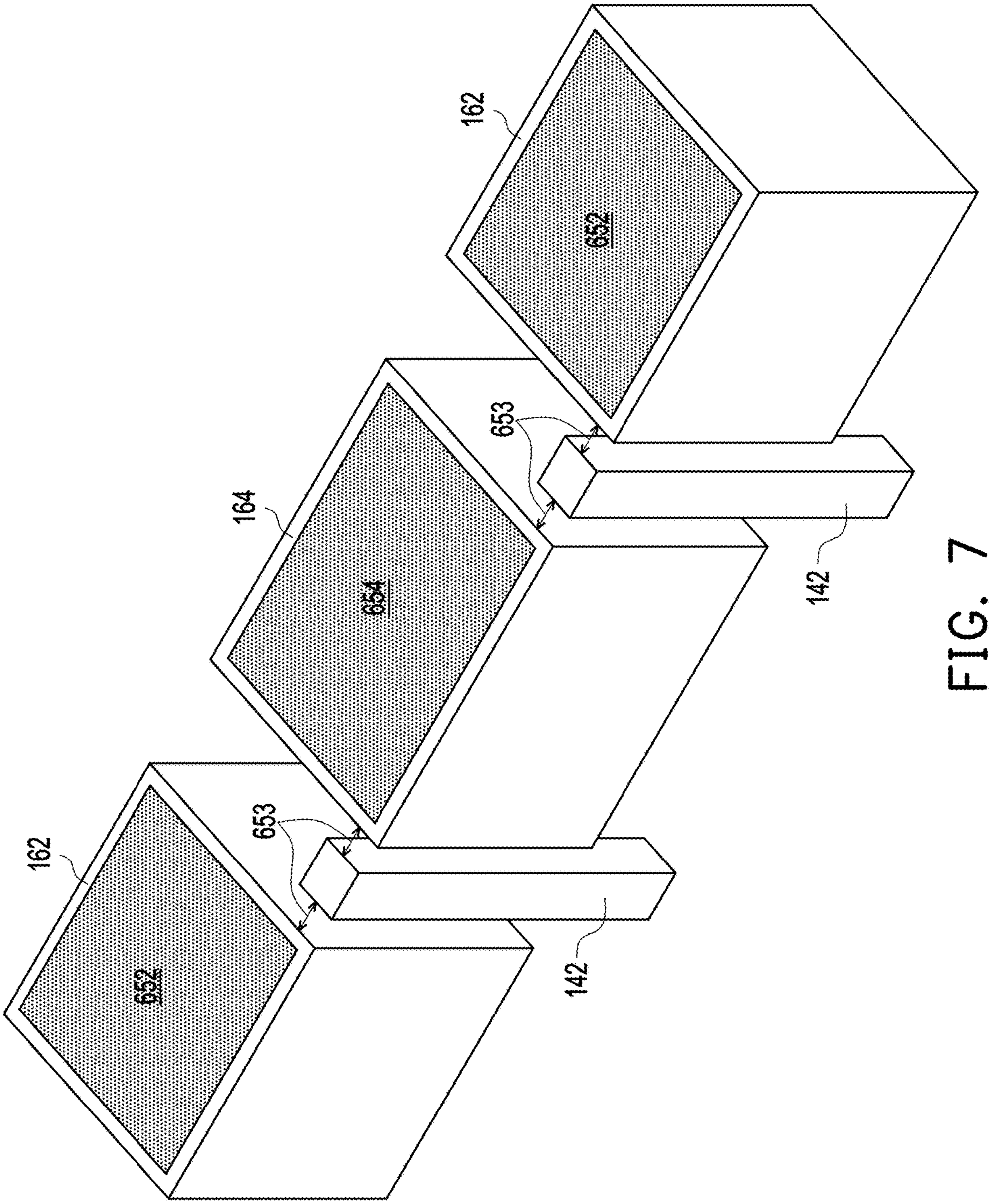
FIG. 7 illustrates a perspective view of the shielding structure of FIG. 6 in accordance with some other embodiments.

FIG. 6 illustrates a cross-sectional view of a probe card with a shielding structure in accordance with some other embodiments. FIG. 7 illustrates a perspective view of the shielding structure of FIG. 6 in accordance with some other embodiments.

Referring to FIG. 6, a testing system having a probe card 30 is provided. The probe card 30 is similar to the probe card 20 illustrated in FIG. 4, but the shielding structures 452, 454 are replaced by the other shielding structures 652, 654 with different three-dimensional configurations. Specifically, as shown in the perspective view of FIG. 7, the shielding structures 652, 654 may be a bulk structure covered by the dielectric layers 162, 164, respectively. In some embodiments, two first shielding structures 652 are horizontally disposed at opposite sides of the loopback probe pins 142, and a second shielding structure 654 is horizontally disposed between the loopback probe pins 142. Similar to the shielding structures 452, 454, the shielding structures 652, 654 are not connected to the ground bumps 24 on the DUT 50 so that the design of the shielding structures 652, 654 will become more flexible to meet customized needs. In some embodiments, a minimum distance 653 between the shielding structures 652/654 and the loopback probe pins 142 is greater than or substantially equal to 6 μm. Selecting the minimum distance 653 of greater than or substantially equal to 6 μm can avoid the undesired contacting of the shielding structures 652, 654 and the loopback probe pins 142 during the testing. Further, the shielding structures 652, 654 may be formed by three-dimensional (3D) printing process, or the like. Accordingly, the shielding structures 652, 654 may include non-specifically shaped structures, such as cube, cylinder, pyramid, or the like.

Figure 8:
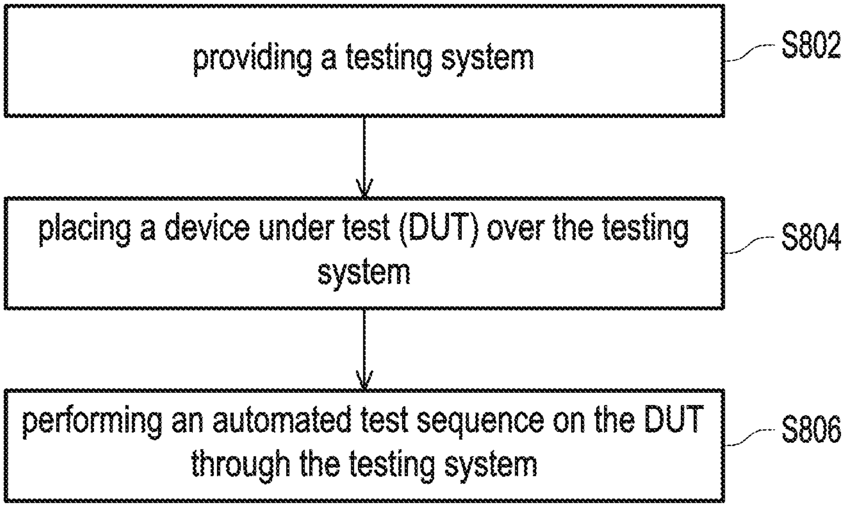
FIG. 8 illustrates a flowchart of a testing method for using a testing system in accordance with some embodiments.
Figure 9:
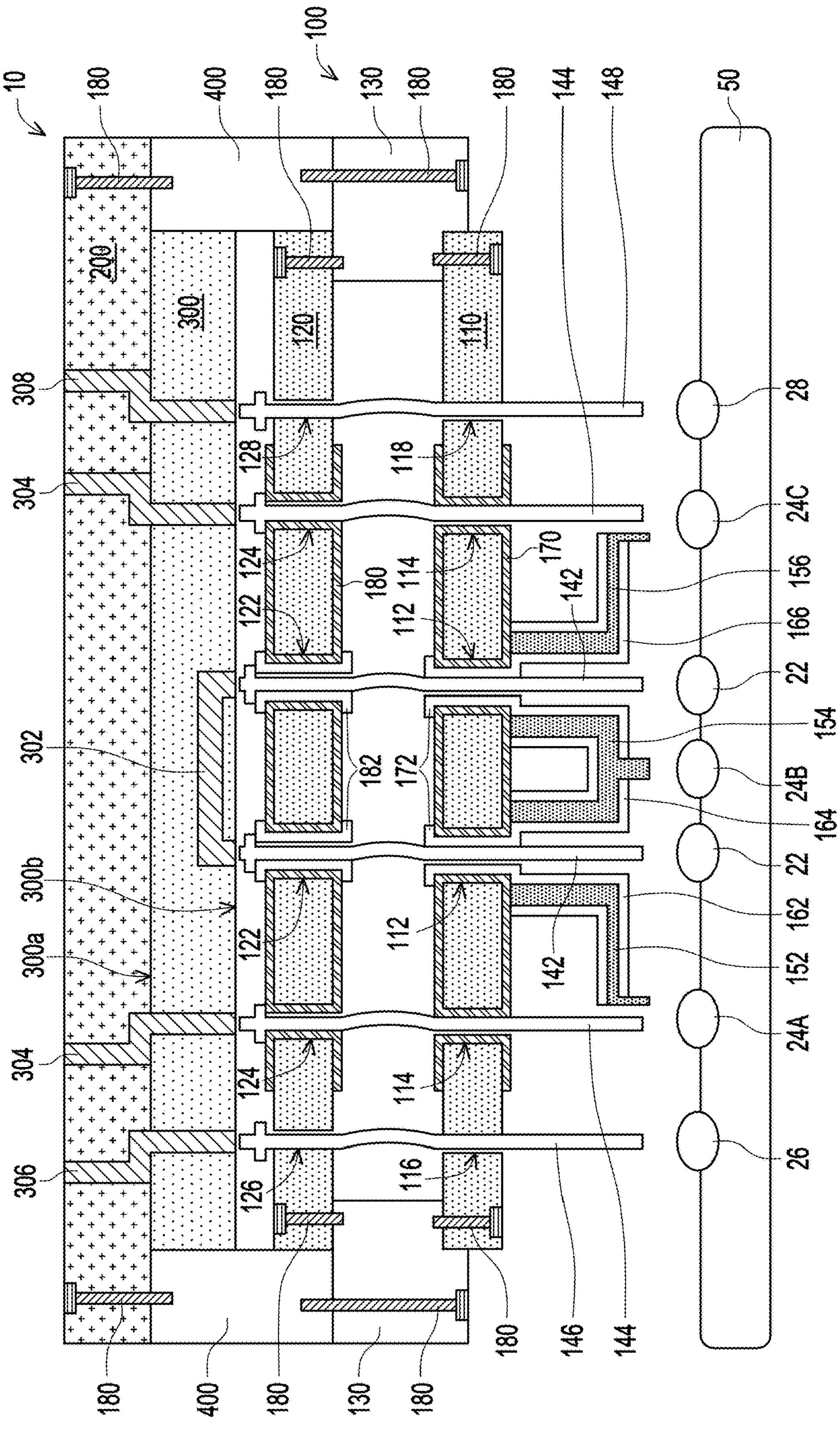
FIG. 9 to FIG. 10 illustrate cross-sectional views of intermediate stages in the using of a probe card in accordance with some embodiments.
Figure 10:
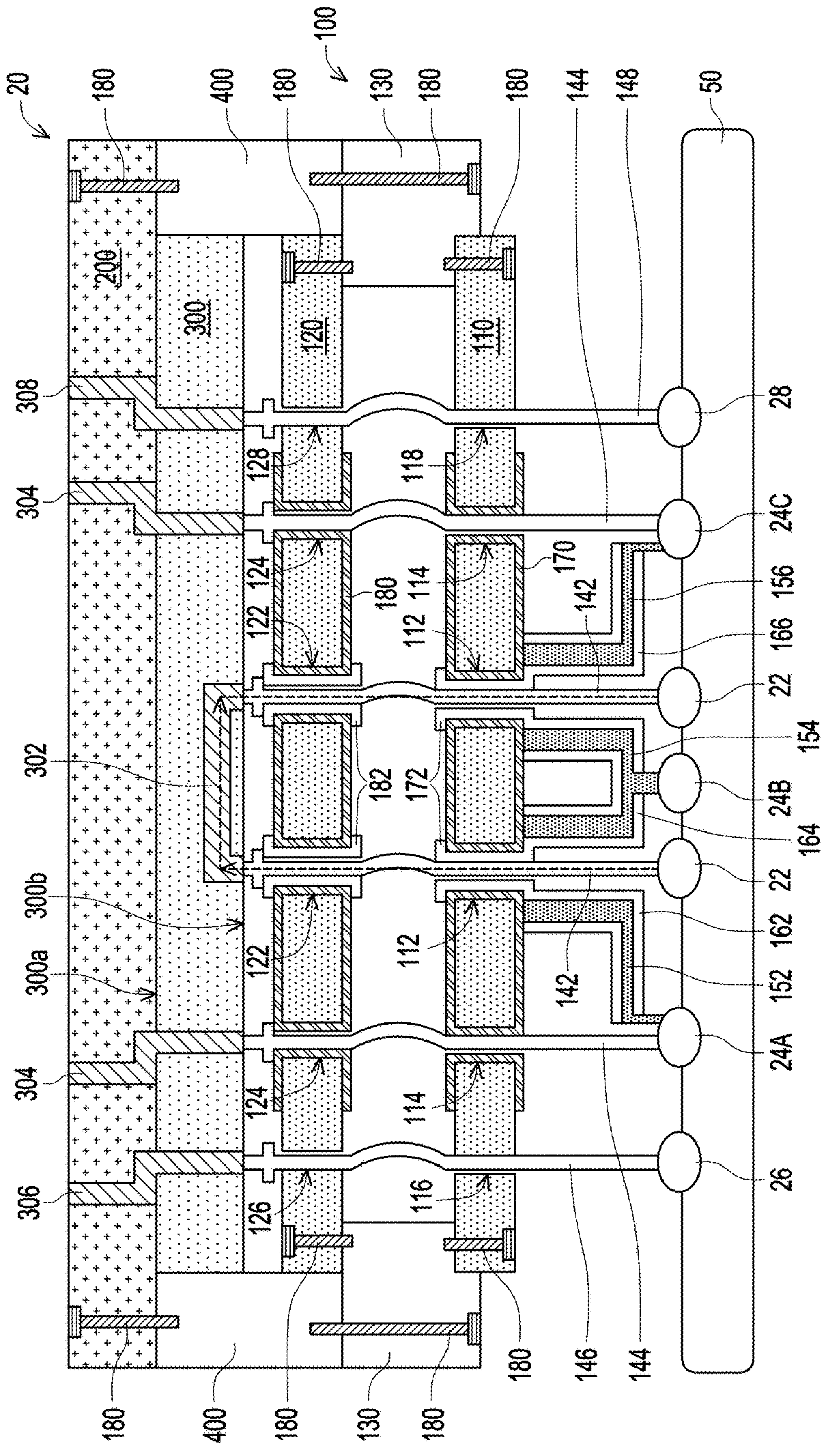

FIG. 8 illustrates a flowchart of a testing method for using a testing system in accordance with some embodiments. FIG. 9 to FIG. 10 illustrate cross-sectional views of intermediate stages in the using of a probe card in accordance with some embodiments.

Referring to FIG. 8, at step S802, a testing system is provided. In some embodiments, the testing system may include the probe card 10, and the probe card 10 may include the space transformer 300, the circuit board 200 over the first surface 300*a* of the space transformer 300, and the probe head 100 over the second surface 300*b* of the space transformer 300, as shown in FIG. 9. The configuration of the probe card 10 has been described in detail in the above embodiments and will not be repeated herein. In addition, the testing system further include a testing device used to perform various test procedures and/or communicate test information to the DUT 50 through the probe card 10. Although FIG. 9 illustrates the testing system including the probe card 10 as an example, the embodiments of the present disclosure are not limited thereto. In other embodiments, the testing system may use the probe card 20 of FIG. 4 or the probe card 30 of FIG. 6 for testing.

At step S804, a device under test (DUT) is placed over the testing system. In some embodiments, the DUT 50 is placed over the testing system, so that the loopback probe pins 142 are configured to contact at the loopback bumps 22 on the DUT 50 to carry a loopback test signal between the loopback bumps 22 on the DUT 50, the ground probe pins 144 are configured to contact the ground bumps 24 on the DUT 50, and the ground probe pins 144 may provide the ground voltage to the shielding structures 152, 154, 156 by contacting the first conductive layer 170, as shown in FIG. 10. In some embodiments, the DUT 50 may be a semiconductor wafer including a semiconductor device, an electronic device, an optoelectronic device, the like, or a combination thereof. In some alternative embodiments, the DUT 50 may be a semiconductor wafer-form package.

At step S806, an automated test sequence is performed on the DUT through the testing system. In some embodiments, performing the automated test sequence includes executing a functional test on the DUT 50, such as a loopback test, a circuit probe (CP) test, or the like.

Based on the above discussions, it can be seen that the present disclosure offers various advantages. It is understood, however, that not all advantages are necessarily discussed herein, and other embodiments may offer different advantages, and that no particular advantage is required for all embodiments.

According to some embodiments, a probe card for testing a device under test (DUT) includes: a space transformer having a first surface and a second surface opposite to each other; a circuit board disposed over the first surface of the space transformer; and a probe head disposed over the second surface of the space transformer. The probe head includes: a lower plate spaced from an upper plate by a spacer; at least two loopback probe pins respectively penetrating through the lower plate and the upper plate to carry a loopback test signal between at least two loopback bumps on the DUT; and a first shielding structure extending from a lower surface of the lower plate toward an upper surface of the DUT and horizontally disposed between the at least two loopback probe pins, wherein the first shielding structure is configured to have a ground voltage.

In some embodiments, further comprising: a first conductive layer overlying a surface of the lower plate; and at least one ground probe pin penetrating through the lower plate and the upper plate to connect a ground bump on the DUT and the space transformer, wherein the at least one ground probe pin provides the ground voltage to the first shielding structure by contacting the first conductive layer. In some embodiments, the first shielding structure is in direct contact with the first conductive layer on the lower surface of the lower plate. In some embodiments, further comprising: a first dielectric layer partially covering the first conductive layer to electrically isolate the first conductive layer from the at least two loopback probe pins, wherein the first dielectric layer has a dielectric constant less than that of the lower plate. In some embodiments, further comprising: a second conductive layer overlying a surface of the upper plate, wherein the at least one ground probe pin further contacts the second conductive layer; a second dielectric layer partially covering the second conductive layer to electrically isolate the second conductive layer from the at least two loopback probe pins; and at least one power probe pin penetrating through the lower plate and the upper plate to contact a power bump on the DUT. In some embodiments, further comprising: a second shielding structure extending from the lower surface of the lower plate toward the upper surface of the DUT and horizontally disposed between the at least two loopback probe pins and the at least one ground probe pin, wherein the second shielding structure is in contact with the first conductive layer to have the same voltage as the first shielding structure. In some embodiments, further comprising: a third dielectric layer partially covering a surface of the first and second shielding structures to electrically isolate the first and second shielding structures from the at least two loopback probe pins.

According to some embodiments, a testing system for testing a device under test (DUT) includes: a first plate having a plurality of first openings extending from an upper surface of the first plate to a lower surface of the first plate; a plurality of probe pins respectively penetrating through the plurality of first openings to be electrically connected to a plurality of bumps on the DUT for testing. The plurality of probe pins includes: at least two first probe pins penetrating through a first group of the plurality of first openings to carry a loopback test signal between at least two first bumps of the plurality of bumps; and at least one second probe pin penetrating through a second group of the plurality of first openings to electrically couple the at least one second bump of the plurality of bumps to ground. The testing system further includes: a first conductive layer overlying a surface of the plurality of first openings and extending to cover the upper surface and the lower surface of the first plate, wherein the at least one second probe pin is in contact with the first conductive layer so that the first conductive layer and the at least one second probe pin have the same voltage; a first shielding structure disposed horizontally between the at least two first probe pins and the at least one second probe pin and vertically between the lower surface of the first plate and an upper surface of the DUT, wherein the first shielding structure has the same voltage as the at least one second probe pin by contacting the first conductive layer on the lower surface of the first plate; and a first dielectric layer overlying the first conductive layer on the first group of the plurality of first openings to electrically isolate the first conductive layer from the at least two first probe pins.

In some embodiments, further comprising: a second plate disposed over and spaced from the first plate, wherein the second plate has a plurality of second openings extending from an upper surface of the second plate to a lower surface of the second plate, and the plurality of second openings respectively correspond to the plurality of first openings, wherein the at least two first probe pins further extend into a third group of the plurality of second openings corresponding to the first group of the plurality of first openings, and the at least one second probe pin further extends into a fourth group of the second plurality of openings corresponding to the second group of the plurality of first openings; and a second conductive layer overlying a surface of the plurality of second openings and extending to cover the upper surface and the lower surface of the second plate, wherein the at least one second probe pin is in contact with the second conductive layer so that the second conductive layer and the at least one second probe pin have the same voltage. In some embodiments, further comprising: a second dielectric layer overlying the second conductive layer on the third group of the plurality of second openings to electrically isolate the second conductive layer from the at least two first probe pins. In some embodiments, further comprising: a third dielectric layer overlying a surface of the first shielding structure, wherein the third dielectric layer has a dielectric constant less than that of the first plate. In some embodiments, the first shielding structure laterally surround the at least two first probe pins. In some embodiments, the first shielding structure extends from the first conductive layer on the lower surface of the first plate to contact the at least one second bump of the plurality of bumps. In some embodiments, the first shielding structure comprises: a vertical portion, extending along a Z direction; and a horizontal portion extending along a XY plane, wherein the horizontal portion has two suspension arms respectively extending along different directions on the XY plane. In some embodiments, further comprising: a second shielding structure disposed horizontally between the at least two first probe pins and vertically between the lower surface of the first plate and the upper surface of the DUT, wherein the second shielding structure has the same voltage as the at least one second probe pin by contacting the first conductive layer on the lower surface of the first plate. In some embodiments, the second shielding structure comprises: a first vertical portion extending along the Z direction and close to one of the at least two first probe pins; a second vertical portion extending along the Z direction and proximate the other of the at least two first probe pins; and a horizontal portion connecting the first vertical portion and the second vertical portion to form a U-shaped structure on a XZ plane.

According to some embodiments, a testing method includes: providing a testing system with a probe head. The probe head includes: a first plate having a plurality of first openings extending from an upper surface of the first plate to a lower surface of the first plate; a first conductive layer overlying a surface of the plurality of first openings and extending to cover the upper surface and the lower surface of the first plate; at least two loopback probe pins penetrating through a first group of the plurality of first openings; at least one ground probe pin penetrating through a second group of the plurality of first openings; and a first shielding structure horizontally disposed between the at least two loopback probe pins. The testing method further includes: placing a device under test (DUT) over the testing system, so that the at least two loopback probe pins are configured to contact at least two loopback bumps on the DUT to carry a loopback test signal between the at least two loopback bumps on the DUT, the at least one ground probe pin is configured to contact a ground bump on the DUT, and the at least one ground probe pin provides a ground voltage to the first shielding structure by contacting the first conductive layer. The testing method further includes: performing an automated test sequence on the DUT through the testing system.

In some embodiments, the probe head further comprises: a second plate disposed over and spaced from the first plate, wherein the second plate has a plurality of second openings extending from an upper surface of the second plate to a lower surface of the second plate, and the plurality of second openings respectively correspond to the plurality of first openings, wherein the at least two loopback probe pins further extend into a third group of the plurality of second openings corresponding to the first group of the plurality of first openings, and the at least one ground probe pin further extends into a fourth group of the second plurality of openings corresponding to the second group of the plurality of first openings; a second conductive layer overlying a surface of the plurality of second openings and extending to cover the upper surface and the lower surface of the second plate, wherein the at least one ground probe pin is in contact with the second conductive layer so that the second conductive layer and the at least one ground probe pin have the same voltage; a first dielectric layer overlying the first conductive layer on the first group of the plurality of first openings to electrically isolate the first conductive layer from the at least two loopback probe pins; and a second dielectric layer overlying the second conductive layer on the third group of the plurality of second openings to electrically isolate the second conductive layer from the at least two loopback probe pins. In some embodiments, the probe head further comprises: a second shielding structure disposed horizontally between the at least two loopback probe pins and the at least one ground probe pin, wherein the second shielding structure has the same voltage as the first shielding structure by contacting the first conductive layer. In some embodiments, the testing system further comprises: a circuit board disposed over the probe head; and a space transformer disposed between the probe head and the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card for testing a device under test (DUT), comprising:
- a space transformer having a first surface and a second surface opposite to each other;
- a circuit board disposed over the first surface of the space transformer; and
- a probe head disposed over the second surface of the space transformer and comprising:
  - a lower plate spaced from an upper plate by a spacer;
  - at least two loopback probe pins respectively penetrating through the lower plate and the upper plate to carry a loopback test signal between at least two loopback bumps on the DUT; and
  - a first shielding structure extending from a lower surface of the lower plate toward an upper surface of the DUT and horizontally disposed between the at least two loopback probe pins, wherein the first shielding structure is configured to have a ground voltage.

2. The probe card of claim 1, further comprising:
- a first conductive layer overlying a surface of the lower plate; and
- at least one ground probe pin penetrating through the lower plate and the upper plate to connect a ground bump on the DUT and the space transformer, wherein the at least one ground probe pin provides the ground voltage to the first shielding structure by contacting the first conductive layer.

3. The probe card of claim 2, wherein the first shielding structure is in direct contact with the first conductive layer on the lower surface of the lower plate.

4. The probe card of claim 2, further comprising:
- a first dielectric layer partially covering the first conductive layer to electrically isolate the first conductive layer from the at least two loopback probe pins, wherein the first dielectric layer has a dielectric constant less than that of the lower plate.

5. The probe card of claim 2, further comprising:
- a second conductive layer overlying a surface of the upper plate, wherein the at least one ground probe pin further contacts the second conductive layer;
- a second dielectric layer partially covering the second conductive layer to electrically isolate the second conductive layer from the at least two loopback probe pins; and
- at least one power probe pin penetrating through the lower plate and the upper plate to contact a power bump on the DUT.

6. The probe card of claim 2, further comprising:
- a second shielding structure extending from the lower surface of the lower plate toward the upper surface of the DUT and horizontally disposed between the at least two loopback probe pins and the at least one ground probe pin, wherein the second shielding structure is in contact with the first conductive layer to have the same voltage as the first shielding structure.

7. The probe card of claim 6, further comprising:
- a third dielectric layer partially covering a surface of the first and second shielding structures to electrically isolate the first and second shielding structures from the at least two loopback probe pins.

8. A testing system for testing a device under test (DUT), comprising:
- a first plate having a plurality of first openings extending from an upper surface of the first plate to a lower surface of the first plate;
- a plurality of probe pins respectively penetrating through the plurality of first openings to be electrically connected to a plurality of bumps on the DUT for testing, wherein the plurality of probe pins comprises:
  - at least two first probe pins penetrating through a first group of the plurality of first openings to carry a loopback test signal between at least two first bumps of the plurality of bumps; and
  - at least one second probe pin penetrating through a second group of the plurality of first openings to electrically couple the at least one second bump of the plurality of bumps to ground;
- a first conductive layer overlying a surface of the plurality of first openings and extending to cover the upper surface and the lower surface of the first plate, wherein the at least one second probe pin is in contact with the first conductive layer so that the first conductive layer and the at least one second probe pin have the same voltage;
- a first shielding structure disposed horizontally between the at least two first probe pins and the at least one second probe pin and vertically between the lower surface of the first plate and an upper surface of the DUT, wherein the first shielding structure has the same voltage as the at least one second probe pin by contacting the first conductive layer on the lower surface of the first plate; and a first dielectric layer overlying the first conductive layer on the first group of the plurality of first openings to electrically isolate the first conductive layer from the at least two first probe pins.

9. The testing system of claim 8, further comprising:

a second plate disposed over and spaced from the first plate, wherein the second plate has a plurality of second openings extending from an upper surface of the second plate to a lower surface of the second plate, and the plurality of second openings respectively correspond to the plurality of first openings, wherein the at least two first probe pins further extend into a third group of the plurality of second openings corresponding to the first group of the plurality of first openings, and the at least one second probe pin further extends into a fourth group of the second plurality of openings corresponding to the second group of the plurality of first openings; and a second conductive layer overlying a surface of the plurality of second openings and extending to cover the upper surface and the lower surface of the second plate, wherein the at least one second probe pin is in contact with the second conductive layer so that the second conductive layer and the at least one second probe pin have the same voltage.

10. The testing system of claim 9, further comprising:

a second dielectric layer overlying the second conductive layer on the third group of the plurality of second openings to electrically isolate the second conductive layer from the at least two first probe pins.

11. The testing system of claim 8, further comprising:

a third dielectric layer overlying a surface of the first shielding structure, wherein the third dielectric layer has a dielectric constant less than that of the first plate.

12. The testing system of claim 8, wherein the first shielding structure laterally surround the at least two first probe pins.

13. The testing system of claim 8, wherein the first shielding structure extends from the first conductive layer on the lower surface of the first plate to contact the at least one second bump of the plurality of bumps.

14. The testing system of claim 8, wherein the first shielding structure comprises:

a vertical portion, extending along a Z direction; and a horizontal portion extending along a XY plane, wherein the horizontal portion has two suspension arms respectively extending along different directions on the XY plane.

15. The testing system of claim 8, further comprising:

a second shielding structure disposed horizontally between the at least two first probe pins and vertically between the lower surface of the first plate and the upper surface of the DUT, wherein the second shielding structure has the same voltage as the at least one second probe pin by contacting the first conductive layer on the lower surface of the first plate.

16. The testing system of claim 15, wherein the second shielding structure comprises:

a first vertical portion extending along the Z direction and close to one of the at least two first probe pins;

a second vertical portion extending along the Z direction and proximate the other of the at least two first probe pins; and a horizontal portion connecting the first vertical portion and the second vertical portion to form a U-shaped structure on a XZ plane.

17. A testing method, comprising:

providing a testing system with a probe head, wherein the probe head comprises:

a first plate having a plurality of first openings extending from an upper surface of the first plate to a lower surface of the first plate;

a first conductive layer overlying a surface of the plurality of first openings and extending to cover the upper surface and the lower surface of the first plate;

at least two loopback probe pins penetrating through a first group of the plurality of first openings;

at least one ground probe pin penetrating through a second group of the plurality of first openings; and a first shielding structure horizontally disposed between the at least two loopback probe pins;

placing a device under test (DUT) over the testing system, so that the at least two loopback probe pins are configured to contact at least two loopback bumps on the DUT to carry a loopback test signal between the at least two loopback bumps on the DUT, the at least one ground probe pin is configured to contact a ground bump on the DUT, and the at least one ground probe pin provides a ground voltage to the first shielding structure by contacting the first conductive layer; and performing an automated test sequence on the DUT through the testing system.

18. The testing method of claim 17, wherein the probe head further comprises:

a second plate disposed over and spaced from the first plate, wherein the second plate has a plurality of second openings extending from an upper surface of the second plate to a lower surface of the second plate, and the plurality of second openings respectively correspond to the plurality of first openings, wherein the at least two loopback probe pins further extend into a third group of the plurality of second openings corresponding to the first group of the plurality of first openings, and the at least one ground probe pin further extends into a fourth group of the second plurality of openings corresponding to the second group of the plurality of first openings;

a second conductive layer overlying a surface of the plurality of second openings and extending to cover the upper surface and the lower surface of the second plate, wherein the at least one ground probe pin is in contact with the second conductive layer so that the second conductive layer and the at least one ground probe pin have the same voltage;

a first dielectric layer overlying the first conductive layer on the first group of the plurality of first openings to electrically isolate the first conductive layer from the at least two loopback probe pins; and a second dielectric layer overlying the second conductive layer on the third group of the plurality of second openings to electrically isolate the second conductive layer from the at least two loopback probe pins.

19. The testing method of claim 17, wherein the probe head further comprises:

a second shielding structure disposed horizontally between the at least two loopback probe pins and the at least one ground probe pin, wherein the second shielding structure has the same voltage as the first shielding structure by contacting the first conductive layer.

20. The testing method of claim 17, wherein the testing system further comprises:

a circuit board disposed over the probe head; and a space transformer disposed between the probe head and the circuit board.

* * * * *